US012772390B2

(12) United States Patent
Stahr et al.

(10) Patent No.: US 12,772,390 B2
(45) Date of Patent: Oct. 20, 2026

(54) COMPONENT CARRIER WITH MAGNETIC ELEMENT, MAGNETIC INLAY, AND MANUFACTURING METHOD

(71) Applicant: AT&S Austria Technologie & Systemtechnik Aktiengesellschaft, Leoben (AT)

(72) Inventors: Johannes Stahr, St. Lorenzen im Mürztal (AT); Gerald Weidinger, Leoben (AT); Ahmad Bader Alothman Alterkawi, Graz (AT); Günther Mayr, Kraubath (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 1122 days.

(21) Appl. No.: 17/663,717

(22) Filed: May 17, 2022

(65) Prior Publication Data

US 2022/0377917 A1 Nov. 24, 2022

Related U.S. Application Data

(60) Provisional application No. 63/189,787, filed on May 18, 2021.

(51) Int. Cl.
*H05K 5/00* (2025.01)
*H05K 5/30* (2025.01)

(52) U.S. Cl.
CPC ......... *H05K 5/0069* (2013.01); *H05K 5/0065* (2013.01); *H05K 5/30* (2025.01)

(58) Field of Classification Search
CPC . H01F 5/00; H01F 17/0013; H01F 2017/0073
(Continued)

(56) References Cited

U.S. PATENT DOCUMENTS 6,359,237 B1 3/2002 Tohya et al.
6,996,892 B1 2/2006 Dening et al.
(Continued)

FOREIGN PATENT DOCUMENTS

CN 101448360 A 6/2009
CN 107046366 A * 8/2017 ......... H01F 17/0013
(Continued)

OTHER PUBLICATIONS

Batev, P.; Extended European Search Report in Application No. 21189107.2; pp. 1-9; Jan. 25, 2022; European Patent Office. 80298, Munich, Germany.
(Continued)

*Primary Examiner* — Shawki S Ismail
*Assistant Examiner* — Joselito S. Baisa
(74) *Attorney, Agent, or Firm* — Robert A. Blaha; Smith Tempel Blaha LLC

(57) ABSTRACT

A component carrier includes a stack having at least one electrically conductive layer structure and/or at least one electrically insulating layer structure and a magnetic element assembled to the stack. The magnetic element includes a magnetic matrix and an inductive element. The inductive element is at least partially enclosed by the magnetic matrix, so that an electric current flow direction through the inductive element is essentially in a horizontal direction with respect to the stack. Further, a magnetic inlay and a manufacturing method are described.

16 Claims, 7 Drawing Sheets

(58) Field of Classification Search
USPC .................................................... 336/84, 200
See application file for complete search history.

(56) References Cited

U.S. PATENT DOCUMENTS

| | | | | |
|---|---|---|---|---|
| 7,843,302 | B2 * | 11/2010 | Mano | H01F 17/06 336/200 |
| 7,920,043 | B2 * | 4/2011 | Nakagawa | H01F 17/0006 336/200 |
| 8,384,507 | B2 * | 2/2013 | Li | H05K 1/165 336/200 |
| 8,790,520 | B2 * | 7/2014 | Hall | H05K 3/4046 216/13 |
| 10,808,316 | B2 * | 10/2020 | Carta | C23C 16/45531 |
| 11,277,907 | B2 * | 3/2022 | Leitgeb | H05K 1/0298 |
| 2002/0182374 | A1 * | 12/2002 | Tung | H05K 1/162 156/81 |
| 2005/0244999 | A1 * | 11/2005 | Masuyama | H05K 1/167 438/106 |
| 2006/0213686 | A1 * | 9/2006 | Wu | H05K 1/115 174/262 |
| 2007/0257761 | A1 * | 11/2007 | Mano | H01F 17/06 336/200 |
| 2008/0211107 | A1 | 9/2008 | Liao | |
| 2009/0045905 | A1 | 2/2009 | Nakagawa et al. | |
| 2012/0212919 | A1 | 8/2012 | Mano et al. | |
| 2015/0279545 | A1 * | 10/2015 | Fazelpour | H01F 17/0013 336/200 |
| 2016/0378215 | A1 * | 12/2016 | Xiao | H05K 1/116 345/173 |
| 2017/0098997 | A1 * | 4/2017 | Hamada | H01F 17/0013 |
| 2017/0178786 | A1 * | 6/2017 | Lambert | H01F 41/0206 |
| 2017/0338034 | A1 * | 11/2017 | Yun | H01F 17/00 |
| 2018/0323133 | A1 * | 11/2018 | Kirby | H01L 23/5227 |
| 2019/0385777 | A1 | 12/2019 | Kodama et al. | |
| 2020/0066627 | A1 * | 2/2020 | Do | H10D 1/20 |
| 2020/0335257 | A1 | 10/2020 | Kodama et al. | |
| 2021/0005550 | A1 | 1/2021 | Chavali et al. | |
| 2022/0093534 | A1 * | 3/2022 | Duong | H01F 27/2804 |

FOREIGN PATENT DOCUMENTS

| | | | | | |
|---|---|---|---|---|---|
| CN | 116779319 | A | * | 9/2023 | H05K 3/301 |
| EP | 3820258 | A1 | * | 5/2021 | H10W 70/635 |
| EP | 4092695 | A1 | * | 11/2022 | H05K 1/185 |
| WO | 2011118072 | A1 | | 9/2011 | |
| WO | WO-2015148996 | A1 | * | 10/2015 | H01F 17/0013 |

OTHER PUBLICATIONS

Office Action in Application No. 202210547378.8; pp. 1-7; Jun. 27, 2026; China National Intellectual Property Administration, No. 6 Xitucheng Road, □Haidian District, Beijing, P.R. China 100088.

Office Action in Application No. 202210547378.8; pp. 1-8; Jun. 27, 2026; China National Intellectual Property Administration, No. 6 Xitucheng Road, □Haidian District, Beijing, P.R. China 100088.

* cited by examiner

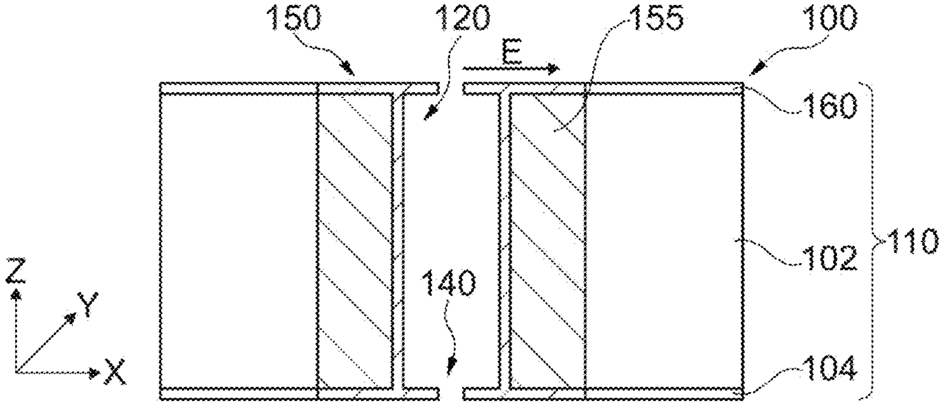
Fig. 1A
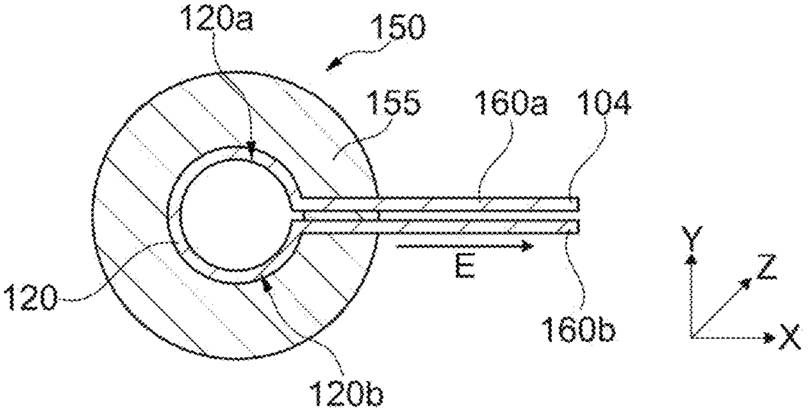
Fig. 1B
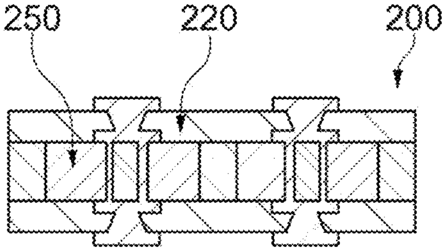
Fig. 2A
-prior art-
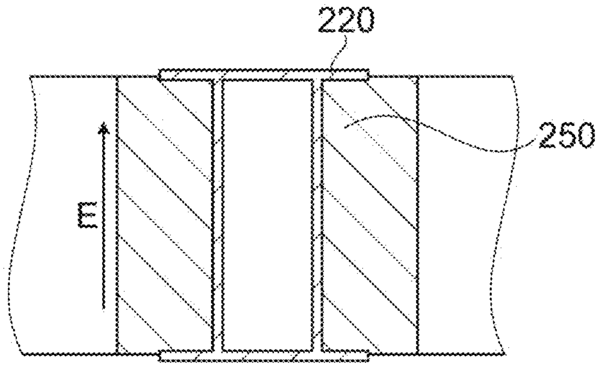
Fig. 2B
-prior art-
Fig. 2C
-prior art-
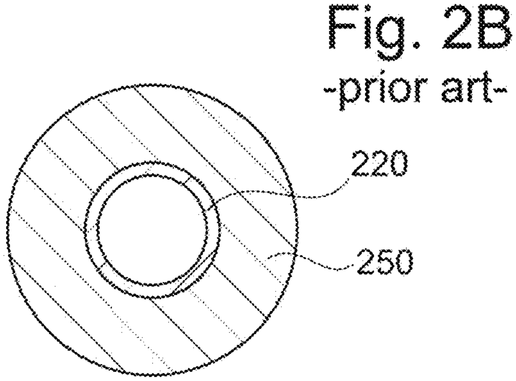

183
182

183
120

183
120
184

155a
183
120
184

183
120
155a 120
155a 155b
155a
150

104
102
102
104
184
150

100
150
102
104
104
124
120
123

COMPONENT CARRIER WITH MAGNETIC ELEMENT, MAGNETIC INLAY, AND MANUFACTURING METHOD

CROSS-REFERENCE TO RELATED APPLICATIONS

This application claims the benefit of the filing date of Provisional Patent Application No. 63/189,787 filed May 18, 2021, the disclosure of which is hereby incorporated herein by reference.

TECHNICAL FIELD

Embodiments of the present invention relate to a magnetic inlay, a component carrier, methods of manufacturing a magnetic inlay and the component carrier, and a method of use of the magnetic element/magnetic inlay.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) becomes an increasing issue. At the same time, component carriers shall be mechanically robust and electrically and magnetically reliable so as to be operable even under harsh conditions.

Moreover, an extended functionality of component carriers is demanded by users. For example, it is known to integrate magnetic material in a component carrier in order to provide/enhance an inductance for specific applications.

For example, a conventional approach of providing a magnetically enhanced inductance for a circuit board 200 is shown in FIGS. 2A to 2C, wherein a magnetic material 250 is printed into drilled holes. The printed magnetic material 250 is then redrilled and plated through holes 220 are generated in the redrilled magnetic material 250 holes. Then, the plated material 220 is surrounded by a barrel of magnetic material 250. The electric current flow direction E of this conventional design is thus in a vertical direction with respect to the circuit board 200 (i.e., along the z-axis of the circuit board 200).

SUMMARY

The conventional approaches may suffer from drawbacks such as low inductance values, high production efforts/costs, and high ohmic resistances. Thus, there may be a need to provide an efficient and robust magnetically enhanced inductance for a component carrier.

A component carrier, a magnetic inlay, methods of manufacturing the component carrier/magnetic inlay, and a use according to the independent claims are provided.

According to an aspect of the disclosure, a component carrier is described, comprising:

i) a stack comprising at least one electrically conductive layer structure and/or at least one electrically insulating layer structure, ii) a magnetic element (may be a magnetic inlay) assembled (mounted on or embedded in) to the stack, wherein the magnetic element comprises:

iia) a magnetic matrix (for example a magnetic sheet or magnetic paste), and iib) an inductive element (for example a copper coil), wherein the inductive element is at least partially enclosed (e.g., encircled or fully encapsulated) by the magnetic matrix, so that an electric current flow direction through the inductive element is (essentially) in a horizontal direction (i.e., oriented along the x- and/or y-axis) with respect to the stack/component carrier (in other words, the electric current flow direction may be oriented (essentially) parallel to a direction of main extension of the stack/component carrier).

According to a further aspect of the disclosure, a (plate-shaped) magnetic inlay (may also be termed a magnetic element) for a component carrier (in particular as described above) is provided. The magnetic inlay comprises:

i) a magnetic matrix having a (essentially) plate-(in particular planar) shape, ii) an inductive element, wherein the inductive element is (at least partially) embedded horizontally in the magnetic matrix, so that an electric current flow direction through the inductive element is (essentially) in a horizontal direction (i.e., along the x- and/or y-axis) with respect to the plate-shaped magnetic matrix/inlay (in other words, the electric current flow direction may be oriented (essentially) parallel to a direction of main extension of the magnetic inlay).

According to a further aspect of the disclosure, there is described a method of manufacturing a component carrier (for example as described above), the method comprising:

i) providing a stack comprising at least one electrically conductive layer structure and at least one electrically insulating layer structure, and ii) at least partially enclosing an inductive element by a magnetic matrix to form a magnetic element assembled to the stack, so that an electric current flow direction through the inductive element is essentially in a horizontal direction with respect to the stack.

According to a further aspect of the disclosure, there is described a method of manufacturing a (plate-shaped) magnetic inlay (in particular as described above) for a component carrier (in particular as described above), the method comprising:

i) providing a magnetic matrix (having a plate-shape), and ii) at least partially embedding an inductive element horizontally in the magnetic matrix, so that an electric current flow direction through the inductive element is (essentially) in a horizontal direction with respect to the magnetic matrix/inlay.

According to a further aspect of the disclosure, there is described a use (method of using) of a magnetic element (in particular a magnetic inlay), in a component carrier layer stack, so that an electric current flow direction through the magnetic element is (essentially) in a horizontal direction (x, y) with respect to the component carrier layer stack.

OVERVIEW OF EMBODIMENTS

In the context of the present document, the term "magnetic element" may refer to any element suitable to be incorporated into a component carrier (such as a circuit board) and which element comprises magnetic properties. The magnetic element may comprise any shape according to the desired functionality, e.g., rectangular (in particular in form of a block), circular, polygonal, etc. A magnetic element may comprise a magnetic matrix (see definition below) into which an inductive element may be placed/embedded. In a specific example, a magnetic element may comprise a magnetic paste. In a preferred example, the magnetic element is arranged in the component carrier in a planar manner (with the directions of main extension being parallel to the component carrier directions of main extension, in other words: arranged horizontally).

The magnetic element may be essentially shaped as a plate and/or planar, meaning that it comprises two directions of main extension along the x- and y-axes (with respect to the component carrier) and a comparably short extension along the z-axis. The term plate-shaped refers in particular to this thickness aspect. The plate-shaped element may comprise a rectangular from, but a circular or polygonal form (or other form) is also possible.

In this context, the term “horizontal” may mean “oriented in parallel with a direction of main extension”, while the term “vertical” may mean “oriented perpendicular to the directions of main extension”. Hence, even if the component carrier is turned around, the terms “vertical” and “horizontal” always have the same meaning.

In the context of the present document, the term “inlay” may refer to a separate component/element that is manufactured in an inlay manufacturing process being (essentially) independent from the component carrier manufacturing process. The inlay may be configured to be surface mounted on or embedded in said component carrier. However, the inlay may be produced, sold, and shipped completely independent of the component carrier. Nevertheless, in an embodiment, the manufacturing process of magnetic inlay and component carrier may be intertwined. The inlay may also be termed “inductor component” and may particularly denote a standalone electronic member which provides an inductance in the framework of an electronic application in which the inductor component is implemented. The inlay may be formed on the basis of component carrier technology, in particular on the basis of printed circuit board (PCB) technology, and may be surface-mounted or embedded in a separately formed component carrier such as a PCB. However, the inlay component may also be used in conjunction with non-component carrier applications.

The magnetic inlay may be essentially shaped as a plate, meaning that it comprises two directions of main extension along the x- and y-axes and a comparably short extension along the z-axis. In this context, the term “horizontal” may thus mean “oriented in parallel with a direction of main extension”, while the term “vertical” may mean “oriented perpendicular to the directions of main extension”. Hence, even if the inlay is turned around, the terms “vertical” and “horizontal” always have the same meaning. Further, the magnetic inlay may comprise different shapes, for example one of circular, rectangular, polygonal.

In a preferred embodiment, the magnetic inlay comprises the magnetic matrix and an electrically conductive structure (e.g., a copper trace) that is (at least partially) (in particular fully) embedded in the magnetic matrix to provide the inductive element. Thereby, a planar inductive element may be provided instead of a coaxial inductor in an efficient, robust, and cost-saving manner. The magnetic matrix may encapsulate (fully) the electrically conductive structure and thus significantly increase the inductance value. Using a magnetic inlay assembled to a component carrier, a large amount of magnetic material may be applied (in comparison to coaxial inductors) which may lead to the high inductance value.

In the context of this document, the terms “magnetic element” and “magnetic inlay” may be used synchronously for some embodiments.

In the context of the present document, the term “magnetic matrix” may in particular refer to a base material (base substance) that comprises magnetic properties. The base material may be magnetic itself or magnetic particles may be distributed within a non-magnetic matrix material. The magnetic matrix may be configured for example rigid/solid (e.g., as magnetic sheets or magnetic film/foil) or viscous (magnetic paste). The magnetic matrix may comprise electrically conductive material/particles and/or electrically insulating material/particles. Further, the magnetic matrix may be configured to have a relative magnetic permeability pr in a range from 20 to 80. A plurality of different materials may be considered suitable to provide the base material and/or the embedded particles of the magnetic matrix, for example a ferromagnetic material (like iron), a ferrimagnetic material (like ferrite), a permanent magnetic material, a soft magnetic material, a metal oxide. In an example, a dielectric (resin) matrix with magnetic particles therein is used. In another example, magnetic sheets are applied that comprise magnetic particles embedded in a fiber-enforced resin (e.g., prepreg). In a further example, a magnetic paste is used that comprises magnetic particles embedded in a not fiber-enforced resin.

In the context of the present document, the term “component carrier” may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, a metal core substrate, an inorganic substrate and an IC (integrated circuit) substrate. A component carrier may also be a hybrid board combining different ones of the above-mentioned types of component carriers.

According to an exemplary embodiment, the disclosure may be based on the idea that an efficient and robust magnetically enhanced inductance (value) for a component carrier can be provided, when a magnetic element/inlay with an inductive element, embedded in a magnetic matrix, is assembled to the component carrier, so that the electric current flow direction through said inductive element is horizontal with respect to the component carrier.

Conventionally (see FIG. 2 above), magnetic material is provided within a circuit board manufacturing process by filling additionally drilled holes in the circuit board with magnetic material (which is then redrilled). This process may be cost-intensive and cumbersome. It is inherent to this conventional design, that an electric current flow direction through the inductive part (the plated through hole) is in a vertical direction with respect to the circuit board. The inductance achieved of such an interplay of magnetic material and plated through holes, may be significantly limited. Further, a high ohmic resistance may occur within this conventional design.

The inventors have now found that it may be surprisingly efficient to provide the magnetic material and the inductive element in a completely different design, wherein the electric current flow direction is in a horizontal direction with respect to the component carrier (layer stack). Several advantageous designs are described in the following, of how such an architecture may be implemented. While one exemplary option may be seen in forming an eccentric hole through the inductive element, another exemplary option may be to provide the inductive element in a horizontally oriented meander-shape.

In particular, a higher inductance value may be provided in this manner, since a larger amount of magnetic material (and accordingly more and larger magnetic particles) may be embedded in component carrier material. Further, the horizontal electric current flow direction may lead to significantly lower ohmic resistance values and a thinner component carrier structure, so that a higher inductance may be obtained, while manufacturing costs may be saved.

According to an embodiment, the main axis of a (electro-) magnetic field, which is generated based on the interaction of the magnetic matrix and the inductive element, is oriented (essentially) parallel to the direction of main extension (x-axis direction) of the stack/component carrier (i.e., oriented horizontally). Thereby, an especially efficient inductance value may be obtained.

While conventionally (see FIG. 2 above) an electric current flow direction through an inductive element is vertical through a circuit board, the present disclosure describes a horizontal electric current flow direction through the inductive element. By shifting the electric current flow direction around 90°, the corresponding electromagnetic field will also by shifted around 90° in comparison to prior art applications.

According to a further embodiment, the inductive element comprises loops, in particular windings, more in particular a coil-like structure. In particular, the directions of main extension (x, y) of the loops/windings are (essentially) parallel to the directions of main direction (x, y) of the component carrier. This may provide the advantage that an inductance may be easily provided merely by the form of an electrically conductive structure.

In the context of the present document, the term “winding” may particularly denote a loop structure (which may be similar to a helical structure with corners), wherein multiple of such loops may form a coil-type arrangement. However, due to the component carrier manufacturing technology (for instance involving lamination) of the magnetic element and/or due to the used component carrier raw materials (for instance involving planar constituents such as plates and foils), the windings of the coil (like) structure may have edge-like or corner-like portions rather than being limited to a composition of multiple interconnected purely circular structures.

According to a further embodiment, the directions of main extension (length x and width y) of the winding are (essentially) parallel to the directions of main extension (length x and width y) of the component carrier. When the magnetic element/inlay and the component carrier are plate-shaped (in particular planar), they may be oriented in parallel with respect to each other. This may provide the advantage of a high inductance value (see above) that can be provided in an easy manner.

It should be noted that the magnetic field of a horizontally (planar) oriented magnetic element may be perpendicular when compared with a magnetic field of a conventional coaxial winding (with respect to the component carrier).

According to a further embodiment, the magnetic matrix is embedded in a first cavity in component carrier material (in particular an electrically insulating layer structure). The first cavity comprises in particular a shape from the group which consists of: a hole (see e.g., FIG. 3G), a slit (see e.g., FIG. 3H), a loop, a winding, a meander (snake-like). This may provide the advantage that the magnetic element/matrix can be directly integrated with a high design flexibility.

In an example, the first cavity may be formed by drilling/routing a hole or a slit (or any other desired shape) in the layer stack material. The first cavity may then be filled by magnetic matrix material, so that the magnetic element comprises a shape suitable for a specific application.

According to a further embodiment, the inductive element is arranged within a second cavity (in the magnetic matrix, in other words: a first magnetic matrix material). In particular, a remaining part of the second cavity (where the inductive element is not arranged) is filled with an electrically insulating material (e.g., resin) and/or (a second) magnetic matrix material. This may provide the advantage that an even higher inductance value may be provided (in particular, when the remaining part is filled with magnetic matrix material).

The second cavity may be formed in (a first) magnetic matrix material. The (first) magnetic matrix material may fill the above-described first cavity. Accordingly, the second cavity may comprise a similar shape as the first cavity. However, the second cavity may be smaller than the first cavity. In some examples, there may be a second cavity but no first cavity (see e.g., FIGS. 6 and 7). In another example, the (first) magnetic matrix is applied as a starting material and the second cavity is formed therein to embed the inductive element (see e.g., FIGS. 6 and 7).

The second cavity may comprise a shape from the group which consists of a hole, a slit, a loop, a winding, a meander (snake-like).

According to a further embodiment, the component carrier further comprises at least one eccentric hole (in particular a vertical (through) hole) arranged through the inductive element, wherein the eccentric hole (electrically) separates a first electrically conductive part from a second electrically conductive part of the inductive element. This may provide the advantage that the horizontal electric current flow direction can be implemented in an efficient, robust, and design flexible manner.

In the context of this document, the term “eccentric” may be interpreted with respect to the middle (center) of the formed via/inductive element. By forming the eccentric hole through inductive element material, said material will be separated and may then comprise, for example, the shape of an open cylinder instead of a closed cylinder. When electrically connecting the inductive element with an (horizontally oriented) electric connector, the electric current will flow in a horizontal direction from the electric connector through the first part, the second part, and again through the electric connector (instead of in a circle again through the first part).

In a further embodiment, the component carrier comprises at least two eccentric holes separating the conductive parts wherein the first electrically conductive part and the second electrically conductive part of the inductive element are electrically connected by an electrically conductive trace.

Preferably, the first eccentric hole completely separates the first part and the second part, while the second eccentric hole does not completely separate the first part and the second part. In an example, the electrically conductive trace is left after forming the eccentric hole. In another example, the electrically conductive trace is formed in an additional step, e.g., by plating.

In other words, the eccentric holes do not completely separate (all of) the parts. The electrical connection may be realized by a conductive trace on one of the surfaces or inner layers of the component carrier, so that electric current can still flow from one part (of the inductive element) to the other.

In a further embodiment, the component carrier comprises three or more eccentric holes (in particular four or more) arranged through the inductive element. The inductive element is thus separated into three or more electrically conductive parts (in particular four). The electrically conductive parts are electrically connected by respective electrically conductive traces (see above) that are left or additionally formed after forming the three or more eccentric holes. In particular, at least some of the electrically conductive traces are arranged in an alternating manner (for example top, bottom, top, bottom, etc. with respect to the magnetic element/component carrier). Hereby, at least one eccentric hole may completely separate two inductive element parts without an electric connection in between, in particular where an electric connector is connected.

Thereby, the electric current flows from a first electric connector part through all inductive element parts (from top to bottom and again from bottom to top, etc.) to a second electric connector part. Preferably, the first and second electric connector parts are also arranged at different heights (top, bottom). Such an electric current flow may, in the context of this document, be regarded as a horizontal electric current flow direction.

This may provide the advantage of a long electric current path that yields a high inductance and low resistance (compare Models 3 to 5 and 9 below).

In an example, the inductance is (only) influenced by the length and count of windings of the inductive element (copper coil) and the magnetic (matrix) material surrounding the element. If the electric current passes through the inductive element from one side of the hole, divided by the eccentrical hole, it has to pass a longer way than just to pass vertically from top to bottom. Depending on the hole diameter and length of the hole this will result in a higher inductance.

According to a further embodiment, there may be two or more eccentric holes formed in the inductive element. Accordingly, a plurality of design options are enabled, when implementing the eccentric hole.

According to a further embodiment, the eccentric hole is (at least partially, in particular fully) filled with an electrically insulating material (e.g., resin) and/or (third) magnetic matrix material. This measure may further improve the inductance value. Further, the eccentric hole may be stabilized in this manner.

According to a further embodiment, the component carrier further comprises a (further magnetic element comprising a) further magnetic matrix assembled to the stack, and a further inductive element. The further inductive element is at least partially enclosed by the further magnetic matrix, so that an electric current flow direction through the further inductive element is (essentially) in a horizontal direction with respect to the stack. In particular, the inductive element and the further inductive element are electrically connected (by one or more electric connector(s)). Thereby, a plurality of magnetic elements may be implemented in a component carrier. Advantageously, the (plurality of) magnetic elements may be connected to provide a common functionality.

According to a further embodiment, the electrical connection is configured so that the inductive element and the further inductive element form a common loop, in particular a common winding. This may provide the advantage that the inductance is even further improved.

In an example, the inductive elements of each magnetic element may be directly connected using an electric connector that forms part of the loop (see e.g., FIG. 5F). In another example, the inductive elements are (respectively) separated in parts by eccentric hole(s), and an electric connector connects the separated parts with each other, thereby also forming part of the loop (see e.g., FIG. 4C or 4D).

According to a further embodiment, the component carrier further comprises an electrical connector. The electrical connector is preferentially assembled to the stack, so that a direction of main extension (x, y) of the electrical connector is oriented (essentially) parallel to a direction (x, y) of main extension of the stack. In this manner, the described horizontal electric current flow direction may be supported in an efficient and design flexible manner.

According to a further embodiment, a first part of the electrical connector is electrically connected to a first part of the inductive element at a first position, and a second part of the electrical connector is electrically connected to a second part of the inductive element at a second position. In particular, the first position and the second position are at different vertical heights (along the z-axis) with respect to the stack/component carrier. This embodiment may be in particular advantageous, when combined with the above-described eccentric hole. Thus, even though the inductive element may be shaped as a ring, slit, or cylinder, the electric current flow direction may not be vertical, but rather horizontal.

According to a further embodiment, the magnetic matrix continuously fills a volume around the electrically conductive structure of the inductive element (and in particular between windings of the inductive element) (full embedding). This may provide the advantage that the electrically conductive structure of the inductive element is enclosed in a stable and robust manner. Further, this may provide the advantage that a high amount of magnetic material can be applied, and an accordingly high inductance can be achieved.

While conventionally only magnetic paste is arranged in small amounts around vias during component carrier manufacturing (which leads to low inductance values), the described (planar) magnetic element may allow for applying a high amount of magnetic matrix (that fills all the space between the vias).

According to a further embodiment, the magnetic matrix comprises at least one of the group consisting of a rigid solid, a sheet, and a paste. Depending on the desired functionality, different configurations of the magnetic matrix may be especially suitable. For example, the magnetic matrix may be configured as a magnetic sheet (rigid) that can be laminated. In this example, the magnetic matrix may comprise a prepreg or another resin with embedded magnetic particles. In another example, the magnetic matrix may be configured as a magnetic paste (viscous) that could be filled/poured in a mold to manufacture the magnetic element.

According to a further embodiment, the magnetic matrix comprises one of the group which consists of: electrically conductive, electrically insulating, partially electrically conductive and partially electrically insulating (e.g., a first electrically conductive part and a second electrically insulating part). Depending on the desired functionality, different configurations of the magnetic matrix may be especially suitable.

According to a further embodiment, the relative magnetic permeability $\mu_r$ of the magnetic matrix is in a range from 2 to 100, in particular 20 to 80, more in particular around 50. These values are comparably high and can lead to an advantageously high inductance value. Permeability is the measure of magnetization that a material obtains in response to an applied magnetic field. The relative permeability, denoted by the symbol $\mu_r$, is the ratio of the permeability of a specific medium $\mu$ to the permeability of free space $\mu_0$ (vacuum).

According to a further embodiment, the magnetic matrix comprises at least one material of the group consisting of a ferromagnetic material (e.g., iron, nickel), a ferrimagnetic material, a permanent magnetic material, a soft magnetic material, a ferrite, a metal oxide (e.g., magnetite), a dielectric matrix (e.g., a resin), in particular a prepreg, with magnetic particles therein, and an alloy, in particular an iron alloy or alloyed silicon. Thereby, established materials can be directly applied to manufacture the magnetic matrix in a cost-efficient manner.

A permanent magnetic material may be ferromagnetic material or ferrimagnetic material, and may for instance be provided on the basis of transition metals (with partially filled 3d shell) such as iron or nickel, or on the basis of rare earths (with partially filled 4f shell).

A soft magnetic material may be a material which can be easily re-magnetized, i.e., having a small area of its hysteresis curve. In other words, soft magnetic materials are those materials that are easily magnetized and demagnetized. They may have intrinsic coercivity less than 1000 $Am^{-1}$.

A ferrite may be denoted as a type of ceramic compound composed of $Fe_2O_3$ combined chemically with one or more additional metallic elements. Ferrites are both electrically non-conductive and ferrimagnetic, so they can be magnetized or attracted by a magnet. Ferrites may be implemented as hard ferrites or soft ferrites, depending on the application.

According to a further embodiment, the magnetic matrix comprises a plate-(planar) shape, and a direction of main extension (x, y) of the magnetic matrix is oriented essentially parallel to a direction of main extension (x, y) of the stack/component carrier/magnetic inlay.

According to a further embodiment, the method further comprises:

i) forming (drilling) a first cavity in stack material, in particular the at least one electrically insulating layer structure (of the stack), and ii) (at least partially filling, in particular fully filling) the first cavity with (first) magnetic matrix material (see e.g., FIGS. 3 to 5) (e.g., by laminating).

According to a further embodiment, the method further comprises:

i) forming (drilling) a second cavity in (first) magnetic matrix material, and ii) (at least partially, in particular fully) filling the second cavity with electrically conductive material, thereby providing the inductive element.

According to a first aspect, the second cavity may be formed in magnetic matrix material that fills the first cavity (see e.g., FIGS. 3 to 5).

According to a second aspect, the second cavity may be formed in magnetic matrix material that represents a starting material (thus there may be no first cavity) (see e.g., FIGS. 6 and 7).

According to a further embodiment, filling the second cavity comprises plating the sidewalls of the second cavity and/or filling the second cavity (e.g., by plating). In particular, the method further comprises drilling a remaining part (of the second cavity, where no inductive element is arranged) into the filled material.

According to a further embodiment, the method further comprises filling a remaining part of the second cavity, which remaining part does not comprise the inductive element, with an electrically insulating material, in particular one of resin material and (second) magnetic matrix material. This may provide the advantage that the inductive element may be embedded (encapsulated) in a robust manner. This may be in particular advantageous, when the inductive element comprises a meander form.

According to a further embodiment, the method further comprises forming (drilling) an eccentric hole (in particular a vertical hole) through the inductive element, thereby separating a first part from a second part of the inductive element.

According to a further embodiment, the method further comprises: filling the eccentric hole (at least partially) with electrically insulating material or (third) magnetic matrix material.

According to a further embodiment, the method further comprises: electrically connecting the inductive element with a further inductive element, so that the inductive element and the further inductive element form a common loop, in particular a common winding.

According to a further embodiment, the method further comprises:

i) providing the inductive element (in particular within an electrically conductive frame structure), and subsequently ii) forming (in particular laminating) magnetic matrix material (at least partially) around the inductive element (and the frame structure). In particular, the inductive element is horizontally (fully) embedded in the magnetic matrix material. This structure may be applied for example as a magnetic inlay.

In this specifically advantageous embodiment (see for example FIG. 8), the horizontal electric current flow direction is realized by an approach that starts with the inductive element. For example, a copper foil may be structured to obtain the desired (winding) structure. Then, the inductive element, which may comprise a (copper) frame structure, may be embedded (in particular fully encapsulated) in magnetic matrix material. For example, a first magnetic matrix material (sheet) may be laminated to a lower part of the inductive element, and a second magnetic matrix material (sheet) may be laminated to an upper part of the inductive element.

According to a further embodiment, the method further comprises forming an electrical connection (in particular a blind via or a through via,) through the magnetic matrix in order to electrically connect the embedded inductive element. Thereby, a robust magnetic inlay with included functionalities may be provided.

In the context of the present document, the term "via" (vertical interconnection access) may refer to an electrical connection between layers in a physical electronic circuit that goes through the plane of one or more adjacent layers. The term via may include through-hole vias, buried vias, and blind vias. While vias may be used to connect only a few layers (in a stack) with each other, a "plated through hole" may be used to connect all layers of a stack. Microvias are used as interconnects between layers in high density interconnect (HDI) substrates and printed circuit boards (PCBs) to accommodate the high I/O density of advanced packages. In the present document, an electrically conductive through connection may be called a via.

According to a further embodiment, the method further comprises:

i) providing the inductive element on a temporary carrier (in particular providing an electrically conductive layer on the temporary carrier and structuring the electrically conductive layer in order to obtain the inductive element), ii) embedding the inductive element in first magnetic matrix material (in particular completely), iii) removing the temporary carrier in order to expose a surface of the inductive element, iv) arranging (in particular printing) second magnetic matrix material on the exposed surface of the inductive element, thereby obtaining the magnetic inlay, v) (optional) sandwiching the magnetic inlay between electrically insulating layer structures (prepregs or other types of resin build-up layers) to obtain the component carrier.

According to a further aspect of the disclosure, a component carrier is provided that comprises:

i) a stack comprising at least one electrically conductive layer structure and/or at least one electrically insulating layer structure, and ii) a magnetic element assembled to the stack, wherein the magnetic element comprises:

iia) a magnetic matrix, and iib) an inductive element, wherein the inductive element is at least partially enclosed by the magnetic matrix.

The component carrier further comprises at least two eccentric holes (in particular at least three eccentric holes, more in particular at least four eccentric holes, more in particular four eccentric holes or more), arranged at least partially through the inductive element. The eccentric hole separates a first electrically conductive part (at least partially) from a second electrically conductive part of the inductive element (in particular several eccentric holes provide at least three parts, more in particular at least four parts).

In an embodiment, the first part and the second part are electrically connected by a (thin) electrically conductive (material) trace that is left (after forming the eccentric holes) between the first part and the second part or by a subsequent plating process on one of the surfaces or inner layers of the component carrier.

In a further embodiment, the component carrier comprises three or more (four or more) eccentric holes and three or more (four or more) (in particular not all of them not completely) separated inductive element parts. At least some of the parts are electrically connected respectively by (thin) electrically conductive (material) traces that are left (after forming the eccentric holes) between the parts (e.g., between the first part and the second part, between the second part and the third part, etc.) or by a conductive trace on one of the surfaces or inner layers of the component carrier. In particular, the (thin) electrically conductive (material) traces are arranged alternatingly, i.e., a top connection, a bottom connection, a top connection, etc. (compare e.g., Models 3 to 5 described below). Hereby, at least two inductive element parts may be completely (electrically conductive) separated by one eccentric hole in order to enable an efficient electrical connection by two parts of an electrical connector.

In an embodiment, the magnetic element may be configured for shielding electromagnetic radiation from propagating within the component carrier or within the stack (for instance from a first portion of the stack to a second portion of the stack). The magnetic element may however also be configured for shielding electromagnetic radiation from propagating between component carrier and an environment. Such a shielding may include a prevention of electromagnetic radiation from propagating from an exterior of the component carrier to an interior of the component carrier, from an interior of the component carrier to an exterior of the component carrier, and/or between different portions of the component carrier. In particular, such a shielding may be accomplished in a lateral direction of the stack (i.e., horizontally) and/or in a stacking direction of the stack (i.e., vertically). In such an embodiment, the magnetic element may function for shielding electromagnetic radiation to thereby suppress undesired effects of electromagnetic interference (EMI), in particular in the radio-frequency (RF) regime.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term “layer structure” may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term “printed circuit board” (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the disclosure are apparent from the examples of embodiment to be described hereinafter and are explained with reference to these examples of embodiment.

BRIEF DESCRIPTION OF THE DRAWINGS

FIG. 1A shows a side view of a component carrier with a horizontal electric current flow direction through a magnetic matrix-enclosed inductive element according to an exemplary embodiment of the disclosure.

FIG. 1B shows a top view of the component carrier of FIG. 1A according to an exemplary embodiment of the disclosure.

FIG. 2A, FIG. 2B and FIG. 2C illustrate conventional examples of a circuit board with a vertical electric current flow direction through a plated through hole.

DETAILED DESCRIPTION OF ILLUSTRATED EMBODIMENTS

Figures 3A, 3B, 3C, 3D, 3E:
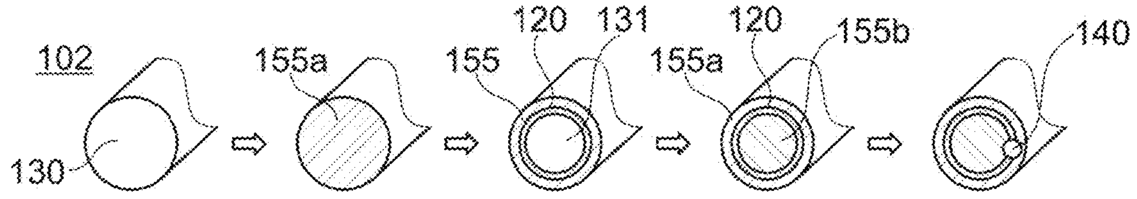
FIG. 3A, FIG. 3B, FIG. 3C, FIG. 3D, FIG. 3E, FIG. 3F and FIG. 3G, respectively, show a method of manufacturing a magnetic element.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the disclosure have been developed.

According to an exemplary embodiment, by using an eccentric borehole in a copper clad hole, which is filled with magnetic paste, a vertical inductor is created. When extending the holes to slits, the properties can be further improved. This concept enables an easy creation of inductor structures in PCBs and low ohmic resistance due to a usage of the copper wall of the drill as an electrical inductor. The changed electric current flow direction allows to build thinner cores.

FIG. 1A and FIG. 1B show a component carrier 100 with a horizontal electric current flow direction through a magnetic matrix-enclosed inductive element according to exemplary embodiments of the disclosure. The component carrier 100 comprises a stack 110 (e.g., a copper-clad laminate or a multilayer stack) comprising electrically conductive layer structures 104 and an electrically insulating layer structure 102 (e.g., a core layer).

According to FIG. 1A, a magnetic matrix 155, being a magnetic sheet, is assembled (embedded in) to the stack 110 and an inductive element 120 is partially enclosed by the magnetic matrix 155. In particular, a through hole in the stack 110 comprises at its sidewalls the magnetic matrix 155, wherein the magnetic matrix 155 is further covered by material of the inductive element 120. At the top and at the bottom of the through hole, the inductive element is electrically connected to an electrical connector 160 and/or to an electrically conductive layer structure 104 of the stack 110. The height of the through hole (and the corresponding core layer) can be very thin, for example around 1 mm.

FIG. 1B shows a top view on the component carrier 100 described for FIG. 1A above. It can be seen that the inductive element 120 is not a closed ring as in the conventional design (see FIG. 2). Instead, a first part 121*a* of the inductive element 120 and a second part 121*b* of the inductive element 120 are electrically disconnected from each other (e.g., separated by a non-depicted eccentric hole). The first part 121*a* is electrically connected to a first part of the electrical connector 160*a*, while the second part 121*b* is electrically connected to a second part of the electrical connector 160*b*. The electrical connector 160 is oriented horizontally to the component carrier 100, i.e., the direction of main extension of the electrical connector 160 is parallel to the direction of main extension (along the x-axis) of the component carrier 100 or stack 110. Since the electrical connector 160 forms part of the inductive element 120 in this manner, a direction of main extension of the inductive element 120 is also oriented parallel to a direction of main extension of the component carrier 100/stack 110.

As the electric current flow direction E is horizontal, a main axis of a magnetic field, which is generated based on the interaction of the magnetic matrix 155 and the inductive element 120, is oriented parallel to the direction of main extension of the stack (along the x-axis).

The outer diameter should be bigger in size than the inner diameter by a factor that considers registration chains.

FIG. 3A to FIG. 3H show a method of manufacturing a component carrier 100 with an eccentric hole 140 according to exemplary embodiments of the disclosure.

In FIG. 3A, a component carrier 100 with an electrically insulating layer structure 102 (e.g., FR4 core) is provided. A first cavity 130 is drilled into the electrically insulating layer structure 102.

As illustrated in FIG. 3B, the first cavity 130 is completely filled by a first magnetic matrix material 155*a*, e.g., a magnetic paste.

In FIG. 3C, a second cavity 131, being smaller than the first cavity 130, is drilled in the first magnetic matrix 155*a*. Subsequently, the sidewalls of the second cavity 131 are plated with an electrically conductive material, in particular copper, thereby providing an inductive element 120 that is partially enclosed by the magnetic matrix 155. The inductive element 120 only fills a first part of the second cavity 131.

As shown in FIG. 3D, the second (remaining) part of the second cavity 131 is completely filled with an insulating material, in this example a second magnetic matrix 155*b*.

In FIG. 3E, the eccentric hole 140 is drilled through the inductive element 120 (and partially through the first/second magnetic matrix 155*a*/155*b*), so that a first part 120*a* of the inductive element 120 and a second part 120*b* of the inductive element 120 are electrically separated from each other.

Figures 3F, 3G:
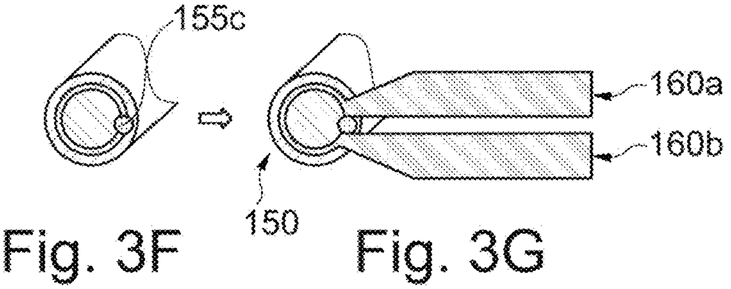

In the example shown in FIG. 3F, the eccentric hole 140 is filled with a third magnetic matrix 155*c*.

In FIG. 3G, the first part 120*a* is electrically connected to a first part of an electrical connector 160*a* and the second part 120*b* is electrically connected to a second part of the electrical connector 160*b*. Hereby, the first connection position and the second connection position are at different vertical (along the z-axis) levels with respect to the stack 110. The electrical connector 160 is assembled to the stack 110, so that a direction of main extension x, y of the electrical connector 160 is oriented parallel to a direction x, y of main extension of the stack 110. At the end of the described method, a magnetic element 150 is obtained, wherein an electric current flow direction E is horizontal with respect to the component carrier 100.

Figure 3H:
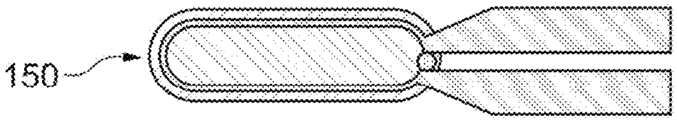
FIG. 3H illustrates an embodiment where the magnetic element is elongated rather than circular in a cross-sectional view. Both embodiments include an eccentric hole.

FIG. 3H shows the same concept as described for FIG. 3G with the difference that the first cavity 130/second cavity 131 is not formed as a hole but as a slit.

FIG. 4A to FIG. 4D show a method of manufacturing a component carrier 100 according to an exemplary embodiment of the disclosure, wherein a plurality of slits are electrically connected to each other to form a common winding structure.

Figures 4A, 4B, 4C:
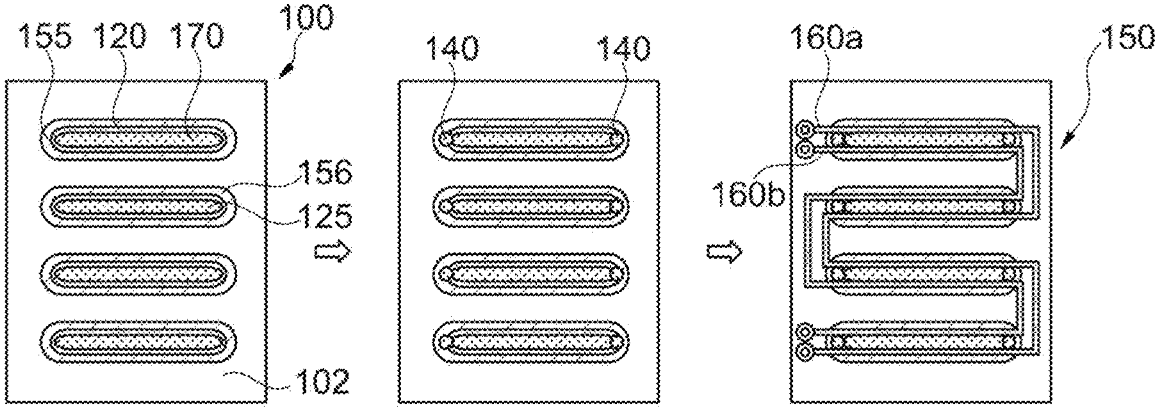
FIG. 4A, FIG. 4B, FIG. 4C and FIG. 4D, respectively, show a method of manufacturing a component carrier with a horizontal electric current flow direction through a magnetic matrix-enclosed inductive element according to an example embodiment.

In FIG. 4A, a plurality of slits are provided that have been manufactured e.g., according to the method described for FIG. 3D above. The only differences being that the second (remaining) part of the second cavity 131 has been filled by insulating resin 170 instead of second magnetic paste 155*b*. A further magnetic matrix 156 is thus assembled to the stack 110 and a further inductive element 125 is embedded in the further magnetic matrix 156.

As shown in FIG. 4B, instead of one eccentric hole 140 (see FIG. 3*e* above), two eccentric holes 140 are drilled (at the outermost ends in the horizontal direction) into each slit structure.

As illustrated in FIG. 4C, in this design, two separated electrical connectors 160 are applied (e.g., using plating and structuring) to electrically connect the plurality of slits with each other. Hence, the inductive element 120 and the further inductive element 125 are electrically connected with each other to thereby form a (common) winding.

Figure 4D:
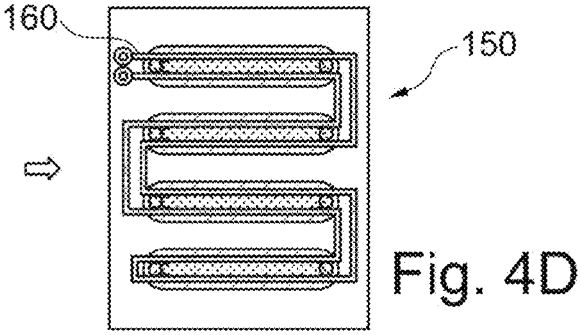

As shown in FIG. 4D, in an embodiment very similar to the one illustrated in FIG. 4C, a continuous electrical connector 160 is applied to electrically connect the slits with each other.

FIG. 5A to FIG. 5F show a method of manufacturing a component carrier 100 according to an exemplary embodiment of the disclosure, wherein a plurality of slits are electrically connected to each other to form a common winding structure (without using eccentric holes).

Figure 5A:
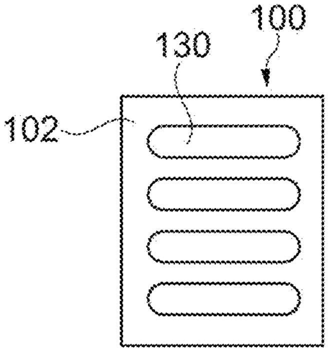
FIG. 5A, FIG. 5B, FIG. 5C, FIG. 5D, FIG. 5E, and FIG. 5F, respectively, show a method of manufacturing a component carrier with a horizontal electric current flow direction through a magnetic matrix-enclosed inductive element according to an example embodiment.

In FIG. 5A, a component carrier 100 with an electrically insulating layer structure 102 (e.g., FR4) is provided. A first cavity 130, having the shape of a slit, is formed into the electrically insulating layer structure 102 four times.

Figure 5B:
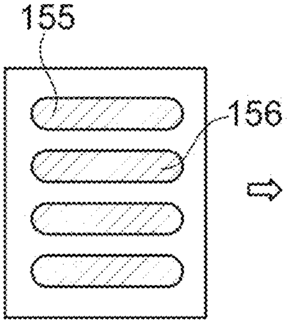

As illustrated in FIG. 5B, the first cavities 130 are completely filled with a first magnetic matrix 155*a*, e.g., a magnetic paste, to provide a magnetic matrix 155 and a further magnetic matrix 156.

Figure 5C:
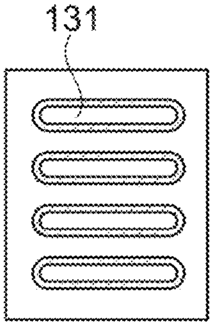

As shown in FIG. 5C, a second cavity 131, being smaller than the first cavity 130, is formed (rerouting) in the first magnetic matrix 155*a*.

Figure 5D:
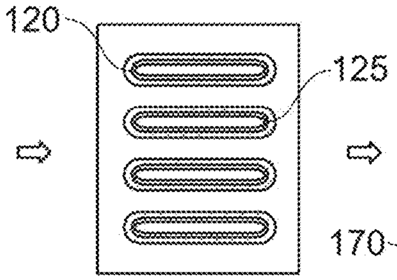

Subsequently, in FIG. 5D, the sidewalls of the second cavity 131 are plated with an electrically conductive material, in particular copper, thereby providing the inductive element 120 and the further inductive element 125.

Figure 5E:
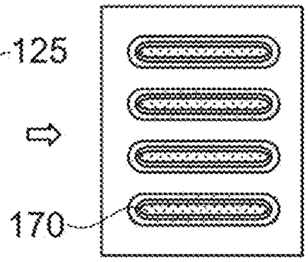

In FIG. 5E, the remaining part of the second cavities 131 is completely filled with an insulating material, in this example an insulating polymer paste 170.

Figure 5F:
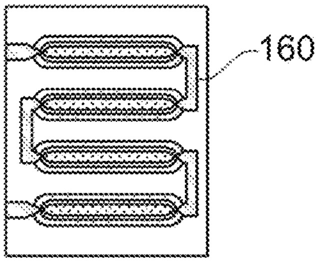

As shown in FIG. 5F, a plurality of one-piece electrical connectors 160 are applied (e.g., using plating and structuring) to electrically connect the inductive element 120 of a first slit with the further inductive element 125 of a second slit, respectively, to thereby form a (common) winding. In contrast to the examples described for FIGS. 4C and 4D above, no eccentric holes 140 are applied here.

FIG. 6A to FIG. 6D show a method of manufacturing a component carrier 100 according to an exemplary embodiment of the disclosure, wherein a meander-shaped inductive element with an eccentric hole is formed.

Figure 6A:
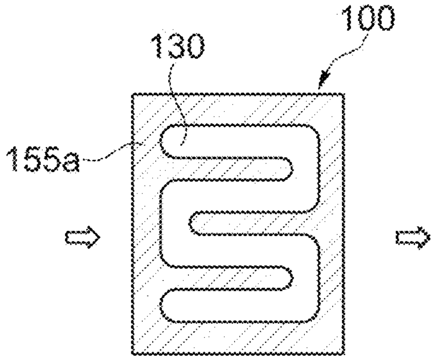
FIG. 6A, FIG. 6B, FIG. 6C, and FIG. 6D, respectively, show a method of manufacturing a component carrier with a horizontal electric current flow direction through a magnetic matrix-enclosed inductive element according to an example embodiment.

In FIG. 6A, a first magnetic matrix 155*a* is provided, either within a component carrier 100 or as a magnetic inlay 150 for a component carrier 100. A second cavity 131, having the shape of a meander (with three windings), is formed (rerouting) into the first magnetic matrix 155*a* (in this example there is no first cavity).

Figure 6B:
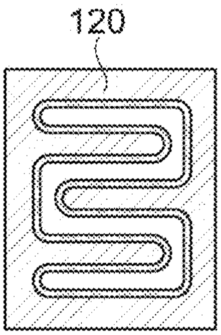

As shown in FIG. 6B, an inductive element 120 is arranged at the sidewalls of the second cavity 131 by plating said sidewalls.

Figure 6C:
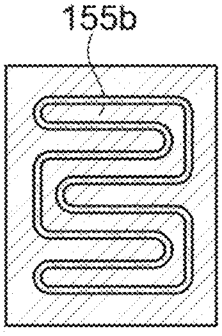

In FIG. 6C, the remaining part of the second cavity 131 is filled with a second magnetic matrix 155*b*.

Figure 6D:
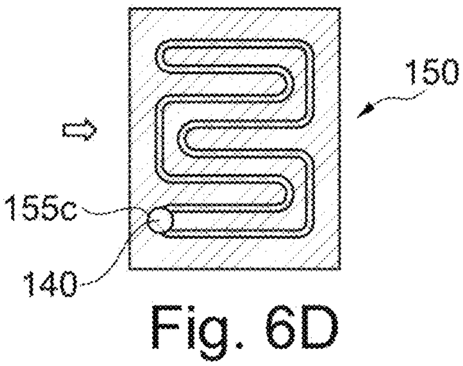

As illustrated in FIG. 6D, the eccentric hole 140 is drilled through the inductive element 120 (and partially through the first/second magnetic matrix material 155*a*/155*b*), so that a first part 120*a* of the inductive element 120 and a second part 120*b* of the inductive element 120 are electrically separated from each other. Further, the eccentric hole 140 is filled with a third magnetic matrix 155*c*. Thereby, a magnetic element 150 is obtained that can be used as an inlay 150 for a component carrier 100.

FIG. 7A to FIG. 7F show a method of manufacturing a component carrier 100 according to an exemplary embodiment of the disclosure, wherein a meander-shaped inductive element without an eccentric hole is formed.

Figure 7A:
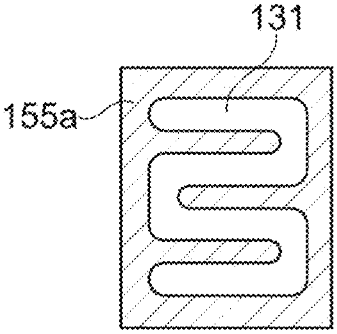
FIG. 7A, FIG. 7B, FIG. 7C, FIG. 7D, FIG. 7E, and FIG. 7F, respectively, show a method of manufacturing a component carrier with a horizontal electric current flow direction through a magnetic matrix-enclosed inductive element according to an example embodiment.

In FIG. 7A, a first magnetic matrix 155*a* is provided, either within a component carrier 100 or as a magnetic inlay 150 for a component carrier 100. A second cavity 131, having the shape of a meander (with three windings), is drilled into the first magnetic matrix 155*a* (in this example, there is no first cavity).

Figure 7B:
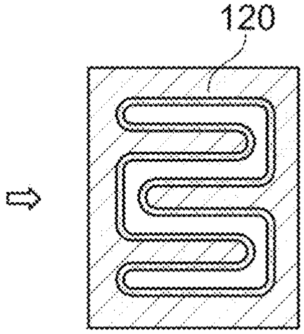

As shown in FIG. 7B, an inductive element 120 is arranged at the sidewalls of the second cavity 131 by plating said sidewalls.

Figure 7C:
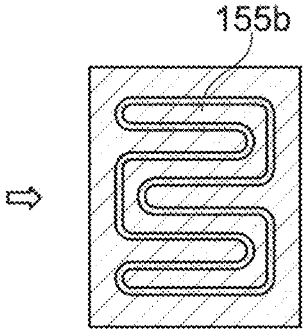

In FIG. 7C, the remaining part of the second cavity 131 is filled with a second magnetic matrix material 155*b*.

Figure 7D:
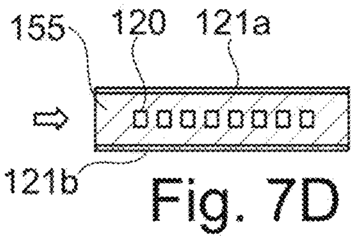

As illustrated in a side view of the product in FIG. 7C, FIG. 7D, shows a further magnetic matrix 155 (magnetic sheet) has been arranged (laminated) on top of the inductive element 120, so that the inductive element 120 is fully embedded horizontally in the center of the magnetic matrix 155. Further, electrically conductive layers 121*a*, 121*b* have been respectively laminated on the top and on the bottom main surface of the magnetic matrix 155.

Figure 7E:
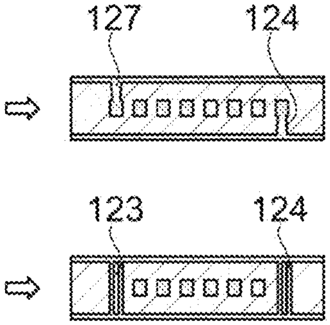

In FIG. 7E, the embedded inductive element 120 is electrically connected by blind vias 123, 124 (Figure above) or plated through holes (Figure below). The vias 123, 124 have been provided by drilling and subsequent plating (either completely filling in the case of blind vias or sidewall-plating in the case of through holes).

Figure 7F:
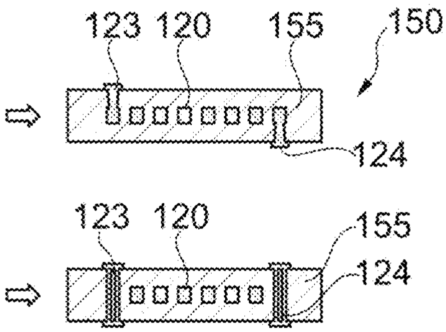

As illustrated in FIG. 7F, the electrically conductive layers 121*a*, 121*b* have been structured (e.g., using photo-structuring) to provide electrically conductive pads that are connected to the blind vias 123, 124 or the plated through hole vias 123, 124. Thereby, a magnetic element 150 is obtained that can be used as an inlay 150 for a component carrier 100.

FIG. 8A to FIG. 8E show a method of manufacturing a component carrier 100 according to an exemplary embodiment of the disclosure, wherein a meander-shaped inductive element is embedded in a magnetic matrix (without an eccentric hole).

Figure 8A:
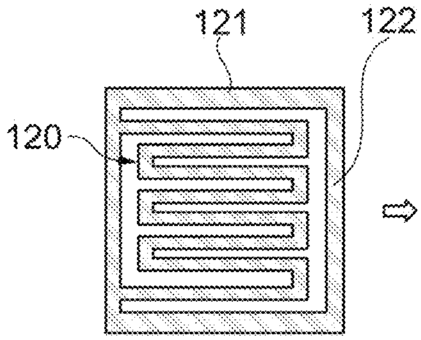
FIG. 8A, FIG. 8B, FIG. 8C, FIG. 8D, and FIG. 8E, respectively, show a method of manufacturing a component carrier with a horizontal electric current flow direction through a magnetic matrix-enclosed inductive element according to an example embodiment.

In FIG. 8A, a meander-shaped inductive element 120 with seven windings is provided and comprises an additional electrically conductive frame structure 121, 122 around the actual windings. Said inductive element 120 can be manufactured, for example, by photo-structuring and/or etching a copper foil.

Figure 8B:
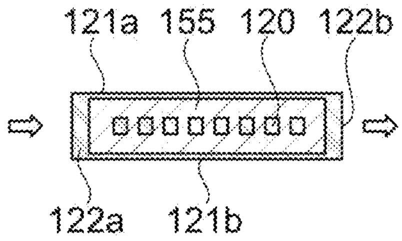

As illustrated in FIG. 8B, the inductive element 120 is laminated with two magnetic matrices 155, in particular magnetic sheets. After embedding the winding part, the electrically conductive frame structure 121, 122 encircles the magnetic matrix 155.

Figure 8C:
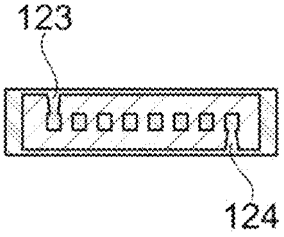

As shown in FIG. 8C, holes are drilled through the electrically conductive frame structures 121*a*, 121*b* above and below the matrix 155, and the magnetic matrix 155, in order to provide connections to the embedded winding part of the inductive element 120. The holes are then filled with copper to provide blind vias 123, 124.

Figure 8D:
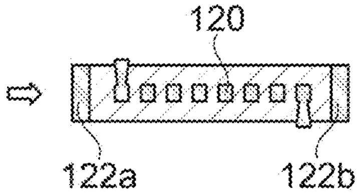

In FIG. 8D, the upper electrically conductive frame structure 121*a* and the lower electrically conductive frame structure 121*b* are removed (electrically conductive pads, however, remain) by photo-structuring, so that the magnetic matrix 155 is exposed.

Figure 8E:
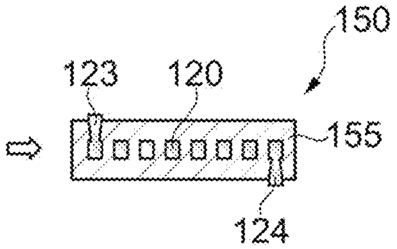

As shown in FIG. 8E, the electrically conductive frame structure 122*a*, 122*b* is completely removed and a magnetic element 150 is obtained that can be used as an inlay 150 for a component carrier 100.

FIG. 9A to FIG. 9I show a method of manufacturing a component carrier 100 according to an exemplary embodiment of the disclosure, wherein an inductive element is embedded in a magnetic matrix (without an eccentric hole).

Figures 9A, 9B, 9C, 9D, 9E, 9F, 9G, 9H, 9I:
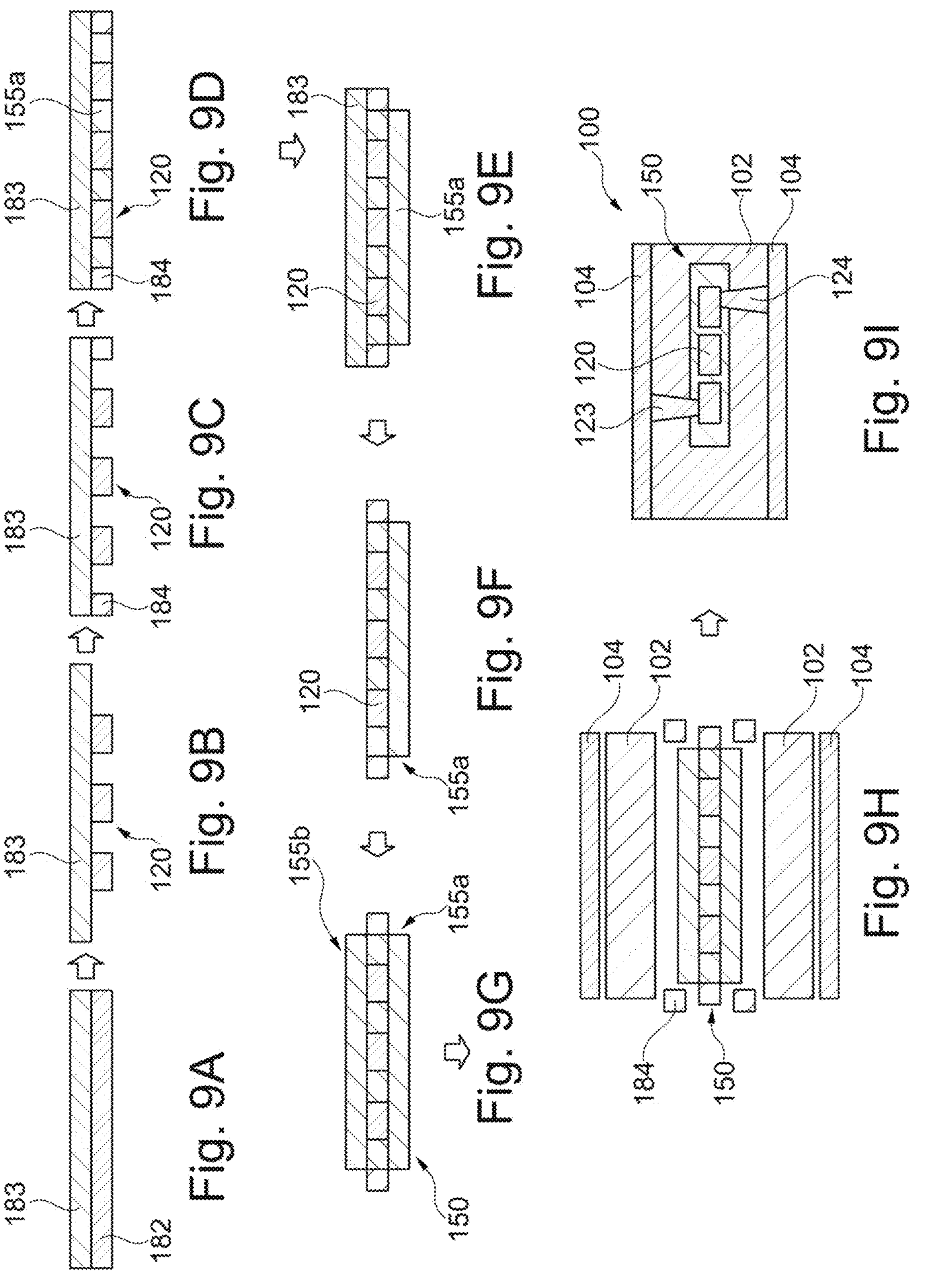
FIG. 9A, FIG. 9B, FIG. 9C, FIG. 9D, FIG. 9E, FIG. 9F, FIG. 9G, FIG. 9H, and FIG. 9I, respectively, show a method of manufacturing a component carrier with a horizontal electric current flow direction through a magnetic matrix-enclosed inductive element according to an example embodiment.

In FIG. 9A, an electrically conductive layer 182 is arranged on a temporary carrier 183.

As shown in FIG. 9B, the electrically conductive layer 182 is structured to obtain an electrically conductive inductive element 120.

In FIG. 9C, an electrically insulating material 184 is formed (at least partially) around the inductive element 120. In the example shown, the electrically insulating material 184 comprises (laser-cut) pieces of prepreg.

As illustrated in FIG. 9D, a first magnetic matrix material 155*a* is arranged (printed) on the temporary carrier 183, so that the inductive element 120 is laterally surrounded by the first magnetic matrix material 155*a*.

In FIG. 9E, a further first magnetic matrix material 155*a* is arranged (printed) on top of the inductive element 120 and covers the same.

As shown in FIG. 9F, the temporary carrier 183 is removed and the inductive element 120 is exposed. The exposed surface of the inductive element 183 is flush with the first magnetic matrix material 155*a* and the (optional) electrically insulating material 184.

In FIG. 9G, a second magnetic matrix material 155*b* is arranged (printed) on the bottom of the inductive element 120 and covers the same, so that the inductive element 120 is completely embedded (encapsulated) in magnetic matrix material 155. Thereby, a magnetic element 150 is obtained that can be used as an inlay 150 for a component carrier 100.

As shown in FIG. 9H, the magnetic inlay 150 is embedded (sandwiched) between two electrically insulating layer structures 102 of component carrier material (e.g., prepreg) and two electrically insulating layer structures 104. Optionally, additional electrically insulating material 184 can be added. Optionally, electrically insulating material 184 can be removed after the magnetic matrix 155 has been applied. In another example, not using electrically insulating material 184 would be preferred, as there is less handling effort. The prepreg/resin from the upper/lower electrically insulating layer structures layers 102 may in such case flow into the gap and thereby fully embed the magnetic matrix element 150 (inlay).

In FIG. 9I, a component carrier 100 with an embedded magnetic inlay 150 is provided. The inductive element 120 is electrically contacted by blind vias 123, 124 that have been drilled through the electrically insulating layer structures 102 and that have been filled by electrically conductive material, respectively.

Figures 10A, 10B, 10C, 10D, 10E, 10F, 10G, 10H, 10I, 10J, 10K, 10L, 10M, 10N, 10O:
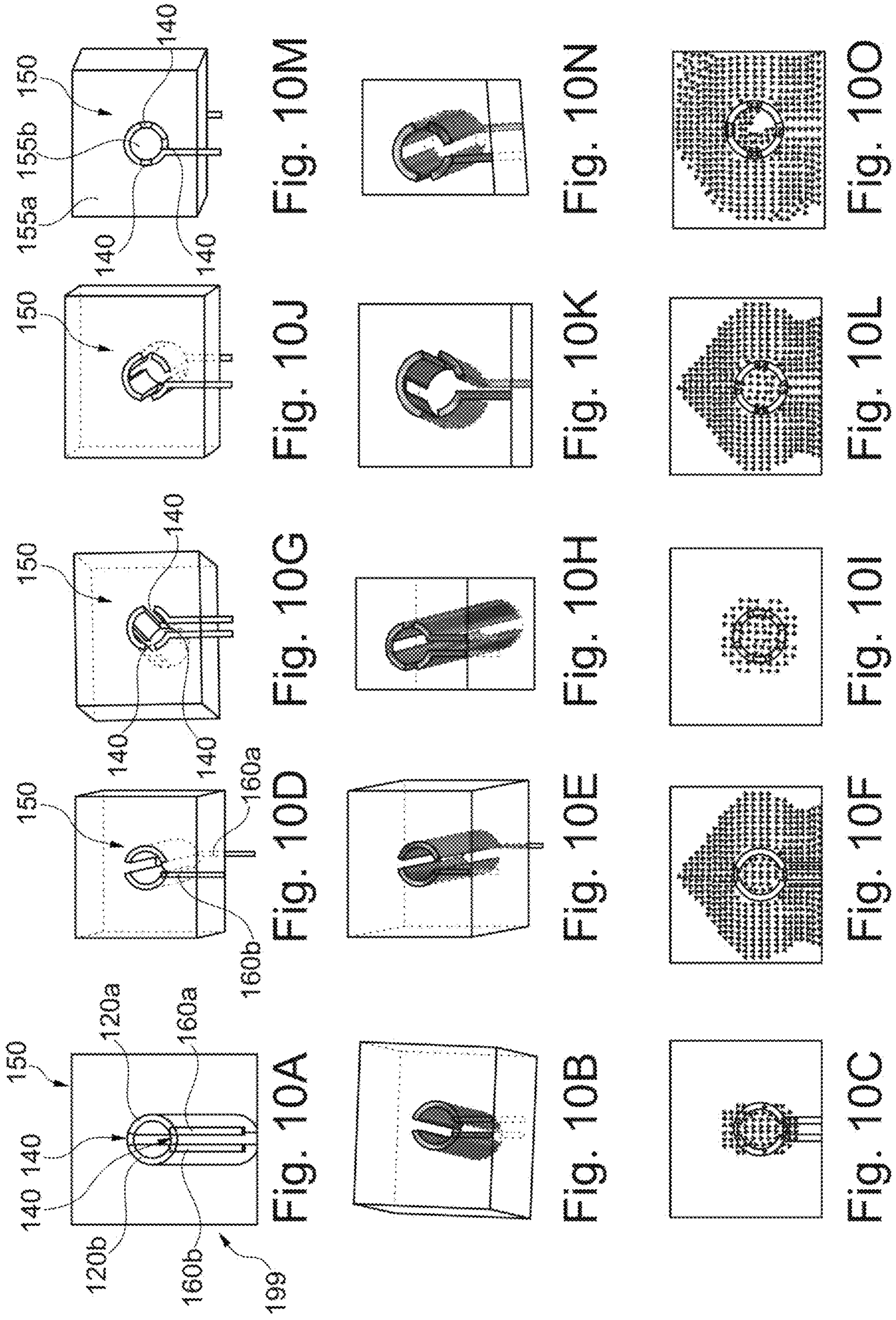
FIG. 10A, FIG. 10B and FIG. 10C illustrate the structures of Model 1 and corresponding simulations according to exemplary embodiments of the disclosure.
FIG. 10D, FIG. 10E and FIG. 10F illustrate the structures of Model 2 and corresponding simulations according to exemplary embodiments of the disclosure.
FIG. 10G, FIG. 10H and FIG. 10I illustrate the structures of Model 3 and corresponding simulations according to exemplary embodiments of the disclosure.
FIG. 10J, FIG. 10K and FIG. 10L illustrate the structures of Model 4 and corresponding simulations according to exemplary embodiments of the disclosure.
FIG. 10M, FIG. 10N and FIG. 10O illustrate the structures of Model 5 and corresponding simulations according to exemplary embodiments of the disclosure.

FIG. 10A to FIG. 10O show the structures of Model 1 to Model 5 and corresponding simulations according to exemplary embodiments of the disclosure.

Model 1 is represented in FIG. 10A. In this example of the magnetic element 150, two eccentric holes 140 are drilled (one of them not completely) through the inductive element 120, so that the inductive element 120 is separated in a first part 120*a* and a second part 120*b*. Each part is connected by a respective electrical connector 160*a*, 160*b* on top of the magnetic element 150. Here, no magnetic material is applied in the via.

FIG. 10B includes a simulation of the current density of Model 1.

FIG. 10C includes a simulation of the magnetic field of Model 1. The field tends to concentrate in the middle of the via (no magnetic material).

Model 2 is represented in FIG. 10D. In this example, two eccentric holes 140 are drilled (one of them not completely) through the inductive element 120, so that the inductive element is separated in a first part 120*a* and a second part 120*b*. The first part 120*a* is connected to the first part of the electrical connector 160*a* at the bottom and the second part 120*b* is connected to the second part of the electrical connector 160*b* at the top of the magnetic element 150. Thus, the electric current flow path is much longer than in Model 1. Here, no magnetic material is applied in the via.

FIG. 10E illustrates a simulation of the current density of Model 2.

FIG. 10F shows a simulation of the magnetic field of Model 2.

Model 3 is illustrated in FIG. 10G. In this example of the magnetic element 150, four eccentric holes 140 are drilled (only one of them completely) through the inductive element 120, so that the inductive element is separated into four parts which are interconnected alternatingly at the top and the bottom. Two parts are respectively an electrical connector 160*a*, 160*b* on top of the magnetic element 150. Here, no magnetic material is applied in the via.

FIG. 10H includes a simulation of the current density of Model 3.

FIG. 10I illustrates a simulation of the magnetic field of Model 3.

Model 4 is represented in FIG. 10J. This example is very similar to Model 3, but the first part of the inductive element 120 is connected to the first part of the electrical connector 160*a* at the bottom and a second part is connected to the second part of the electrical connector 160*b* at the top of the magnetic element 150. Here, no magnetic material is applied in the via.

FIG. 10K includes a simulation of the current density of Model 4.

FIG. 10L includes a simulation of the magnetic field of Model 4.

Model 5 is represented in FIG. 10M. This example is very similar to Model 4, but the via is embedded in magnetic matrix material 155*a* and filled with magnetic matrix material 155*b*.

FIG. 10N includes a simulation of the current density of Model 5.

FIG. 10O includes a simulation of the magnetic field of Model 5.

Table 1 below shows the simulation results of Models 1 to 5 with respect to the inductance (in nH) and the resistance (in mΩ) for different magnetic properties (μ). It can be seen that Model 5 (four eccentric holes, via filled with magnetic matrix material, and via embedded in magnetic matrix material 155*a*) shows the highest inductance value.

TABLE 1

| | Model 1 | Model 2 | Model 3 | Model 4 | Model 5 |
|---|---|---|---|---|---|
| Inductance (μ = 5) | 0.733 | 1.93 | 1.44 | 2.67 | 3.18 |
| Inductance (μ = 10) | 0.779 | 3.13 | 1.53 | 3.92 | 4.67 |
| Resistance (μ = 5) | 65 | 41 | 166 | 132 | 166 |
| Resistance (μ = 10) | 70 | 43 | 176 | 141 | 198 |

FIG. 11A to FIG. 11D show the structures of Models 6 to Model 9 according to exemplary embodiments of the disclosure.

Figure 11A:
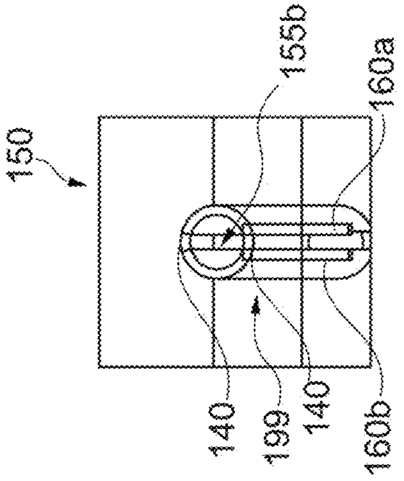
FIG. 11A illustrates the structures of Model 6 of the disclosure.

Model 6 is represented in FIG. 11A. This example is very similar to Model 1, but the via has been filled with magnetic matrix material 155*b*. In the simulation, air 199 is surrounding the via.

Figure 11B:
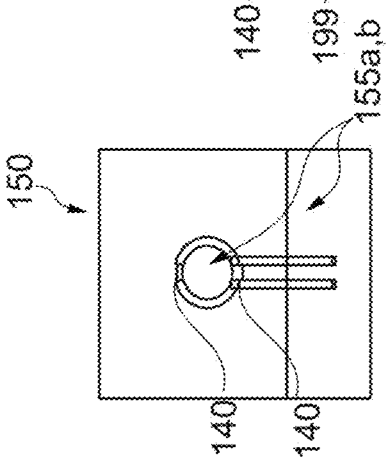
FIG. 11B illustrates the structures of Model 7 of the disclosure.

Model 7 is illustrated in FIG. 11B. This example is very similar to Model 6, but the via is surrounded by magnetic matrix material 155*a*.

Figure 11C:
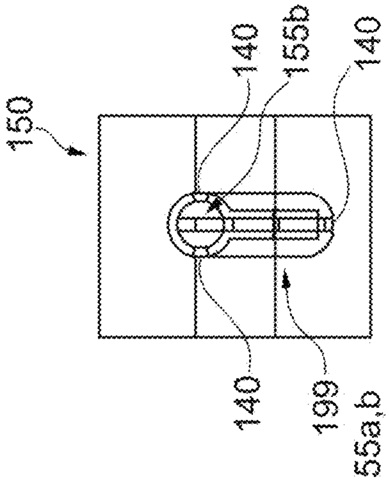
FIG. 11C illustrates the structures of Model 8 of the disclosure.

Model 8 is shown in FIG. 11C. This example is very similar to Model 6, but four eccentric holes have been formed (compare Models 3 to 5). The via is filled with magnetic matrix material 155*b* and surrounded by air in the simulation.

Figure 11D:
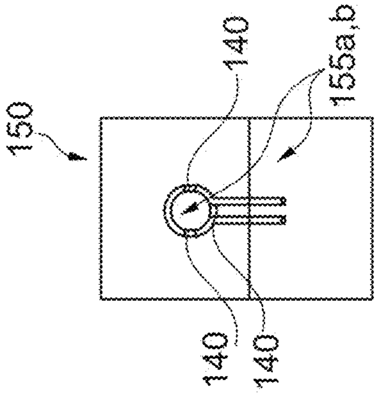
FIG. 11D illustrates the structures of Model 9 of the disclosure.

Model 9 is shown in FIG. 11D. This example is very similar to Model 8, but instead of air, magnetic matrix material 155*a* is surrounding the via.

Table 2 below shows the simulation results of Models 6 to 9 with respect to the inductance (in nH) and the resistance (in mΩ) for different magnetic properties (μ). It can be seen that Model 9 (four eccentric holes, via filled with magnetic matrix material and embedded in magnetic matrix material) shows the highest inductance value.

TABLE 2

| | Model 6 | Model 7 | Model 8 | Model 9 |
|---|---|---|---|---|
| Inductance (μ = 5) | 0.705 | 1.07 | 1.36 | 2.05 |
| Inductance (μ = 10) | 0.745 | 1.3 | 1.43 | 2.4 |
| Resistance (μ = 5) | 63 | 90 | 154 | 200 |
| Resistance (μ = 10) | 67 | 115 | 161 | 242 |

It should be noted that the term "comprising" does not exclude other elements or steps and the "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

REFERENCE SIGNS

100 Component carrier
102 Electrically insulating layer structure
104 Electrically conductive layer structure
110 Layer stack
120 Electrically conductive structure, inductive element
**120*a*** First part inductive element
**120*b*** Second part inductive element
121 Electrically conductive frame structure/layer
**121*a*** Upper electrically conductive frame structure
**121*b*** Lower electrically conductive frame structure
**122*a*** Left side electrically conductive frame structure
**122*b*** Right side electrically conductive frame structure
123 First via
124 Second via
125 Further inductive element
130 First cavity
131 Second cavity
140 Eccentric hole
150 Magnetic element, magnetic inlay
155 Magnetic matrix
**155*a*** First magnetic matrix material
**155*b*** Second magnetic matrix material
**155*c*** Third magnetic matrix material
156 Further magnetic matrix
160 Electric connector
**160*a*** First part of electric connector
**160*b*** Second part of electric connector
170 Resin material
182 Electrically conductive layer
183 Temporary carrier
184 Electrically insulating material
199 Air
E Electric current flow direction
200 Conventional circuit board
220 Conventional plated through hole
250 Conventional magnetic material

The invention claimed is:

1. A component carrier, comprising:

a stack comprising at least one electrically conductive layer structure and/or at least one electrically insulating layer structure;

a magnetic element assembled to the stack, wherein the magnetic element comprises:

a magnetic matrix; and an inductive element, wherein the inductive element is at least partially enclosed by the magnetic matrix; and an electrical connector formed on the stack, wherein the electrical connector has a direction of main extension oriented substantially parallel to a direction of main extension of the stack, and wherein a first part of the electrical connector is electrically connected to a first part of the inductive element and a second part of the electrical connector is electrically connected to a second part of the inductive element, such that an electric current flow direction through the inductive element is in a horizontal direction with respect to the stack.

2. The component carrier according to claim 1, wherein a main axis of a magnetic field, which is generated based on an interaction of the magnetic matrix and the inductive element, is parallel to a direction of main extension of the stack.

3. The component carrier according to claim 1, wherein the inductive element comprises one or more loops, windings, or a coil-like structure.

4. The component carrier according to claim 1, wherein the magnetic matrix is embedded in a first cavity of the stack, and wherein the first cavity comprises a shape from the group which consists of: a hole, a slit, a loop, a winding, a meander.

5. The component carrier according to claim 4, wherein the inductive element is arranged in a second cavity of the magnetic matrix, wherein a remaining part of the second cavity is filled with an electrically insulating material and/or second magnetic matrix material, wherein the second cavity comprises a shape from the group which consists of: a hole, a slit, a loop, a winding, a meander.

6. The component carrier according to claim 1, wherein the component carrier comprises:

at least one eccentric hole arranged through the inductive element, wherein the eccentric hole separates, at least partially, a first electrically conductive part from a second electrically conductive part of the inductive element.

7. The component carrier according to claim 6, wherein the first electrically conductive part and the second electrically conductive part of the inductive element are electrically connected by an electrically conductive trace.

8. The component carrier according to claim 7, wherein the component carrier comprises three or more eccentric holes arranged through the inductive element, wherein the inductive element is separated into three or more electrically conductive parts, wherein at least two of the electrically conductive parts are electrically connected by a respective electrically conductive trace, wherein two or more electrically conductive traces are arranged in an alternating manner.

9. The component carrier according to claim 6, wherein the at least one eccentric hole is at least partially filled with an electrically insulating material and/or a third magnetic matrix material.

10. The component carrier according to claim 1, wherein the component carrier comprises:

a second magnetic matrix assembled to the stack; and a second inductive element at least partially enclosed by the second magnetic matrix such that an electric current flow direction through the second inductive element is in a horizontal direction with respect to the stack;

wherein the inductive element and the second inductive element are electrically connected.

11. The component carrier according to claim 10, wherein an electrical connection is configured such that the inductive element and the second inductive element form a common loop.

12. The component carrier according to claim 1, wherein a first part of the electrical connector is electrically connected to a first part of the inductive element at a first position, and wherein a second part of the electrical connector is electrically connected to a second part of the inductive element at a second position.

13. The component carrier according to claim 12, wherein the first position and the second position are at different vertical heights with respect to the stack.

14. The component carrier according to claim 1, wherein the magnetic matrix comprises at least one of the following features:

wherein the magnetic matrix continuously fills a volume around the inductive element between windings of the inductive element;

wherein the magnetic matrix comprises at least one of the group consisting of a rigid solid, a sheet, and a paste;

wherein the magnetic matrix comprises one of the group which consists of: electrically conductive, electrically insulating, partially electrically conductive and partially electrically insulating;

wherein the relative magnetic permeability $\mu_r$ of the magnetic matrix is in a range from 2 to 100;

wherein the magnetic matrix comprises at least one material of the group consisting of a ferromagnetic material, a ferrimagnetic material, a permanent magnetic material, a soft magnetic material, a ferrite, a metal oxide, a dielectric matrix, a prepreg, with magnetic particles therein, and an alloy or alloyed silicon;

wherein the magnetic matrix comprises a planar shape, and wherein a direction of main extension of the magnetic matrix is parallel to a direction of main extension of the stack.

15. A method of manufacturing a component carrier, the method comprising:

providing a stack comprising at least one electrically conductive layer structure and at least one electrically insulating layer structure;

assembling a magnetic element to the stack, the magnetic element comprising a magnetic matrix, wherein assembling includes at least partially enclosing an inductive element by the magnetic matrix to form the magnetic element;

forming an electrical connector on the stack such that the electrical connector has a direction of main extension oriented substantially parallel to a direction of main extension of the stack, wherein a first part of the electrical connector is electrically connected to a first part of the inductive element and a second part of the electrical connector is electrically connected to a second part of the inductive element, such that an electric current flow direction through the inductive element is in a horizontal direction with respect to the stack.

16. The method according to claim 15, further comprising:

forming a first cavity in the at least one electrically insulating layer structure; and at least partially filling the first cavity with first magnetic matrix material;

forming a second cavity in the first magnetic matrix material; and at least partially filling the second cavity with electrically conductive material, thereby providing the inductive element;

wherein filling the second cavity comprises:

plating the sidewalls of the second cavity; or filling the second cavity;

wherein the method further comprises:

forming a remaining part in the filled second cavity;

wherein the method further comprises:

filling a remaining part of the second cavity, which remaining part does not comprise the inductive element, with an electrically insulating material and/or second magnetic matrix material;

wherein the method further comprises:

forming an eccentric hole through the inductive element, thereby separating a first part from a second part of the inductive element; and filling the eccentric hole at least partially with electrically insulating material or third magnetic matrix material;

wherein the method further comprises:

electrically connecting the inductive element with a second inductive element such that the inductive element and the second inductive element form a common loop.

* * * * *